(12) United States Patent
Pellizer et al.

(10) Patent No.: US 7,259,040 B2
(45) Date of Patent: Aug. 21, 2007

(54) PROCESS FOR MANUFACTURING A PHASE CHANGE MEMORY ARRAY IN CU-DAMASCENE TECHNOLOGY AND PHASE CHANGE MEMORY ARRAY MANUFACTURED THEREBY

(75) Inventors: Fabio Pellizer, Follina (IT); Roberto Bez, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 355 days.

(21) Appl. No.: 10/902,508

(22) Filed: Jul. 29, 2004

(65) Prior Publication Data
US 2005/0064606 A1 Mar. 24, 2005

(30) Foreign Application Priority Data
Aug. 5, 2003 (EP) .................. 03425536

(51) Int. Cl.
*H01L 21/06* (2006.01)
*H01L 29/02* (2006.01)
*H01L 47/00* (2006.01)

(52) U.S. Cl. .................. 438/102; 438/466; 438/597; 257/2; 257/295; 257/E21.665; 257/E27.004

(58) Field of Classification Search .............. 438/102, 438/3, 95, 258, 241; 257/E27.004, E45.002, 257/2

See application file for complete search history.

(56) References Cited

U.S. PATENT DOCUMENTS

| | | | |
|---|---|---|---|
| 5,789,277 A | 8/1998 | Zahorik et al. | 438/95 |
| 5,814,527 A | 9/1998 | Wolstenholme et al. | 438/5 |
| 5,869,843 A | 2/1999 | Harshfield | 257/5 |
| 5,912,839 A * | 6/1999 | Ovshinsky et al. | 365/185.03 |
| 5,933,365 A | 8/1999 | Klersy et al. | 365/148 |
| 5,952,671 A | 9/1999 | Reinberg et al. | 257/3 |
| 5,970,336 A | 10/1999 | Wolstenholme et al. | 438/238 |
| 6,031,287 A | 2/2000 | Harshfield | 257/734 |
| 6,545,903 B1 * | 4/2003 | Wu | 365/148 |
| 6,778,426 B2 * | 8/2004 | Hosotani | 365/158 |
| 6,849,892 B2 * | 2/2005 | Hideki | 257/298 |

(Continued)

FOREIGN PATENT DOCUMENTS

EP 1 318 552 A1 6/2003

(Continued)

OTHER PUBLICATIONS

Palun, L. et al., "Fabrication of Single Electron Devices by Hybrid (E-Beam/DUV) Lithography," *Microelectronic Engineering 53*, pp. 167-170, 2000.

*Primary Examiner*—B. William Baumeister
*Assistant Examiner*—Igwe U. Anya
(74) *Attorney, Agent, or Firm*—Lisa K. Jorgenson; Hai Han; Seed IP Law Group PLLC

(57) ABSTRACT

A process for manufacturing a phase change memory array, includes the steps of: forming a plurality of PCM cells, arranged in rows and columns; and forming a plurality of resistive bit lines for connecting PCM cells arranged on a same column, each resistive bit lines comprising a respective phase change material portion, covered by a respective barrier portion. After forming the resistive bit lines, electrical connection structures for the resistive bit lines are formed directly in contact with the barrier portions of the resistive bit lines.

29 Claims, 8 Drawing Sheets

U.S. PATENT DOCUMENTS

| | | | |
|---|---|---|---|
| 6,974,734 B2* | 12/2005 | Pellizzer et al. | 438/182 |
| 2001/0002046 A1 | 5/2001 | Reinberg et al. | 257/3 |
| 2002/0017701 A1 | 2/2002 | Klersy et al. | 257/536 |
| 2002/0080647 A1 | 6/2002 | Chiang et al. | 365/175 |
| 2002/0160551 A1* | 10/2002 | Harshfield | 438/102 |
| 2003/0075778 A1 | 4/2003 | Klersy | 257/536 |
| 2003/0117831 A1 | 6/2003 | Hush | 365/148 |
| 2003/0185047 A1* | 10/2003 | Khouri et al. | 365/163 |
| 2003/0214856 A1* | 11/2003 | Pellizzer et al. | 365/200 |
| 2003/0219924 A1* | 11/2003 | Bez et al. | 438/102 |
| 2003/0231530 A1* | 12/2003 | Bez et al. | 365/200 |
| 2004/0051094 A1* | 3/2004 | Ooishi | 257/5 |
| 2004/0124503 A1* | 7/2004 | Harshfield | 257/622 |
| 2005/0098811 A1* | 5/2005 | Ogiwara | 257/295 |
| 2005/0111247 A1* | 5/2005 | Takaura et al. | 365/2 |

FOREIGN PATENT DOCUMENTS

| | | |
|---|---|---|
| EP | 1 326 254 A1 | 7/2003 |
| WO | WO 00/57498 | 9/2000 |
| WO | WO 02/09206 A1 | 1/2002 |

* cited by examiner

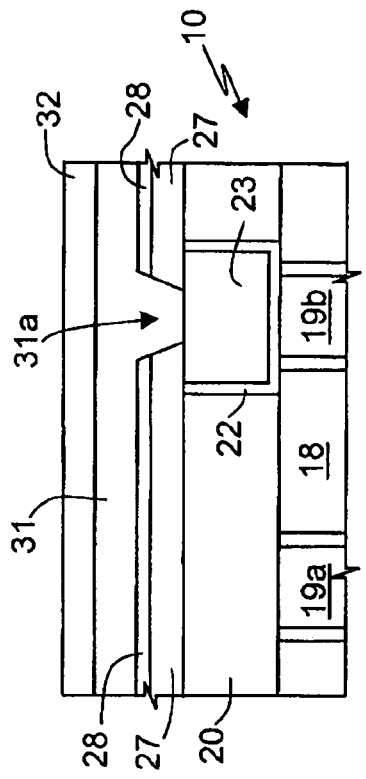
FIG. 4
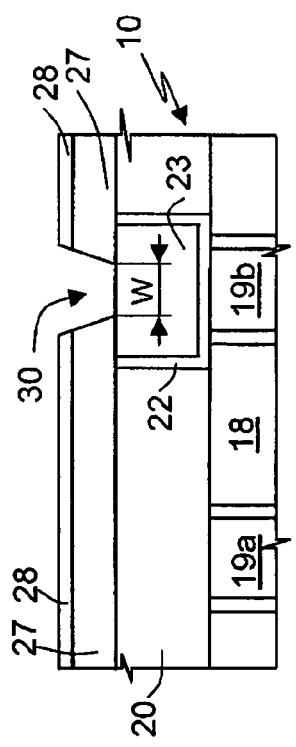
FIG. 5
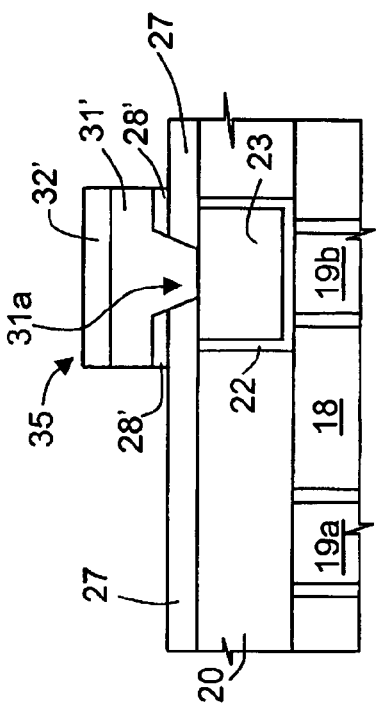
FIG. 7
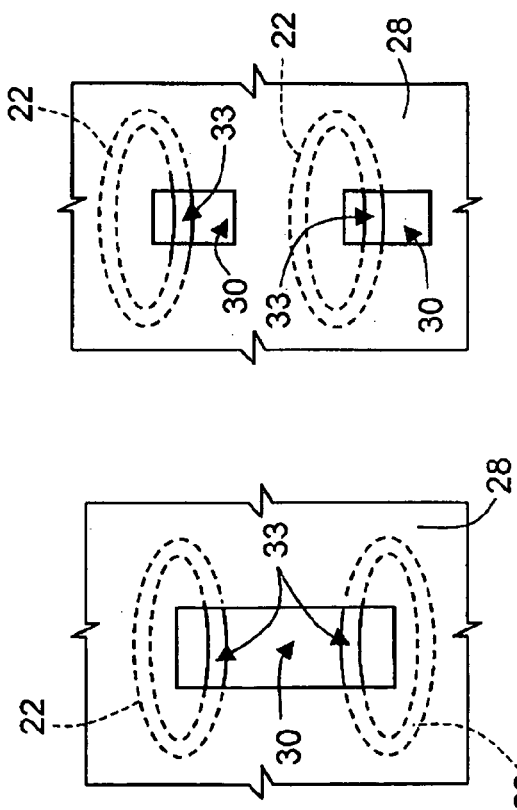
FIG. 6
FIG. 8

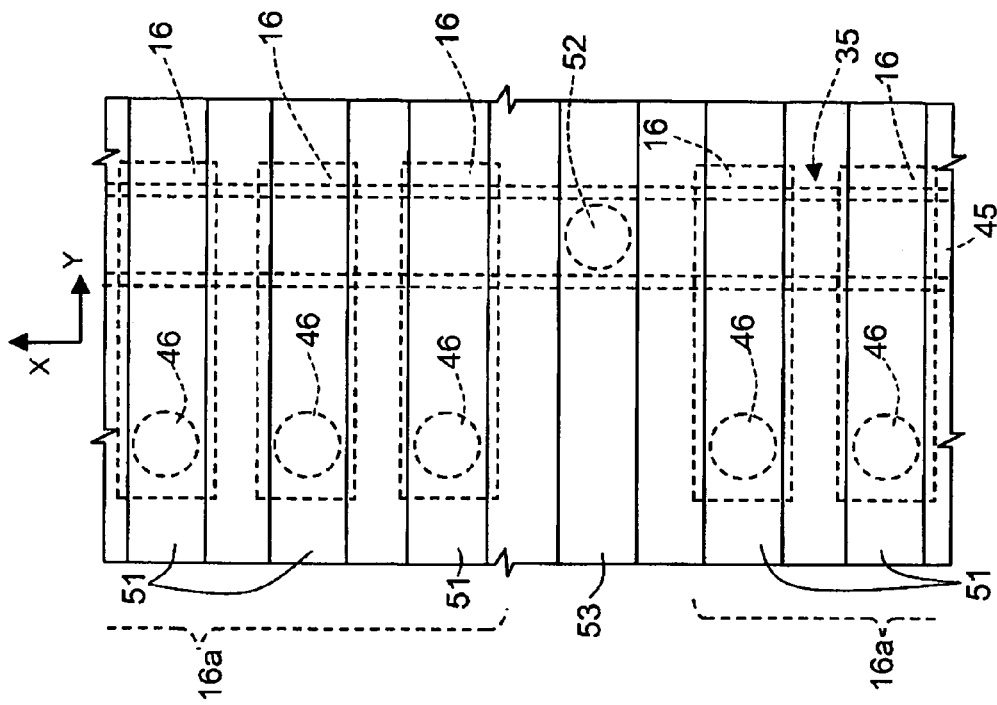
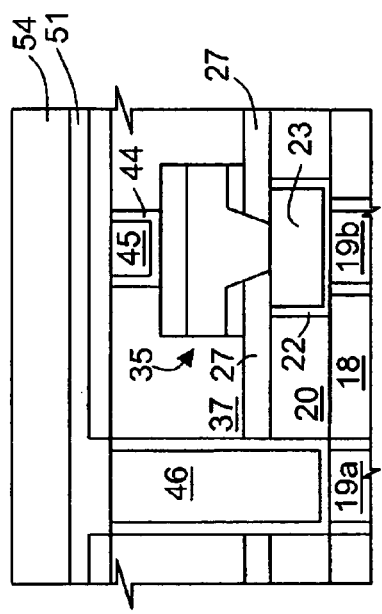
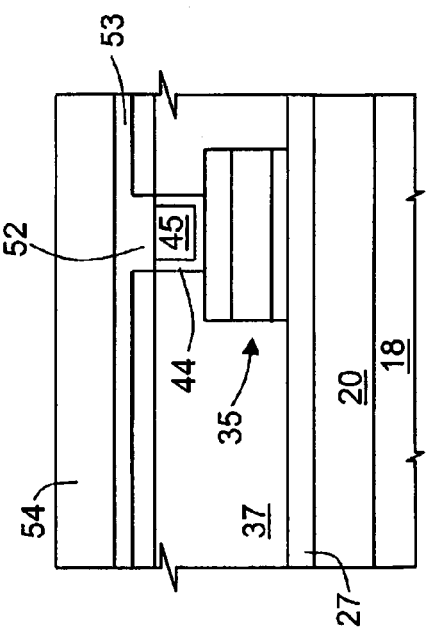

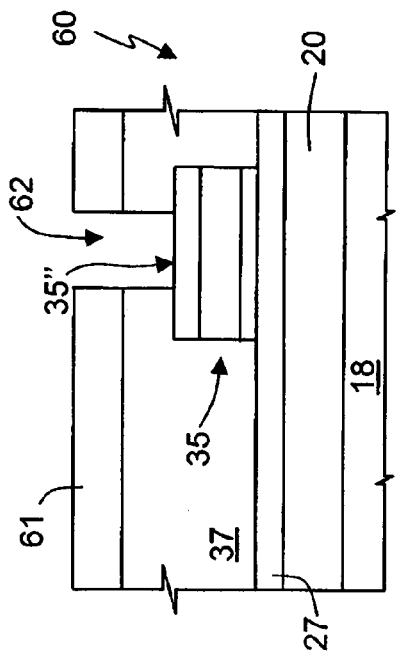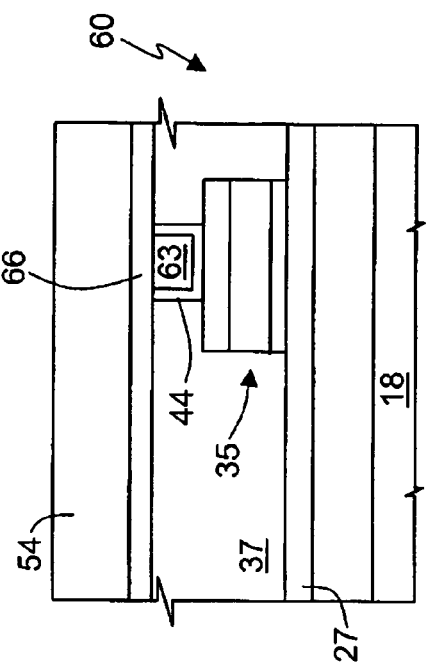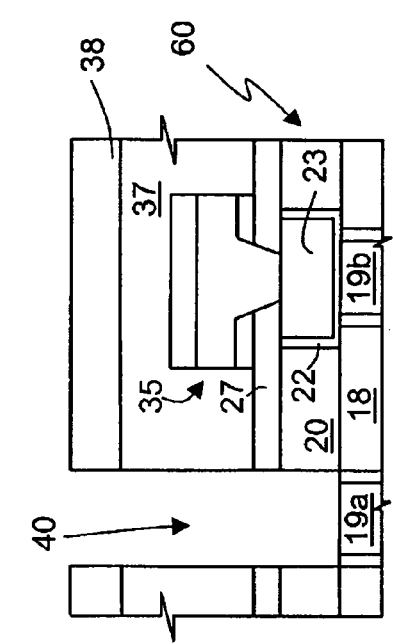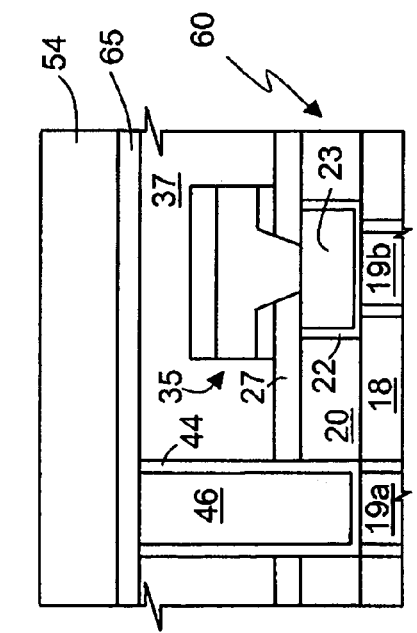

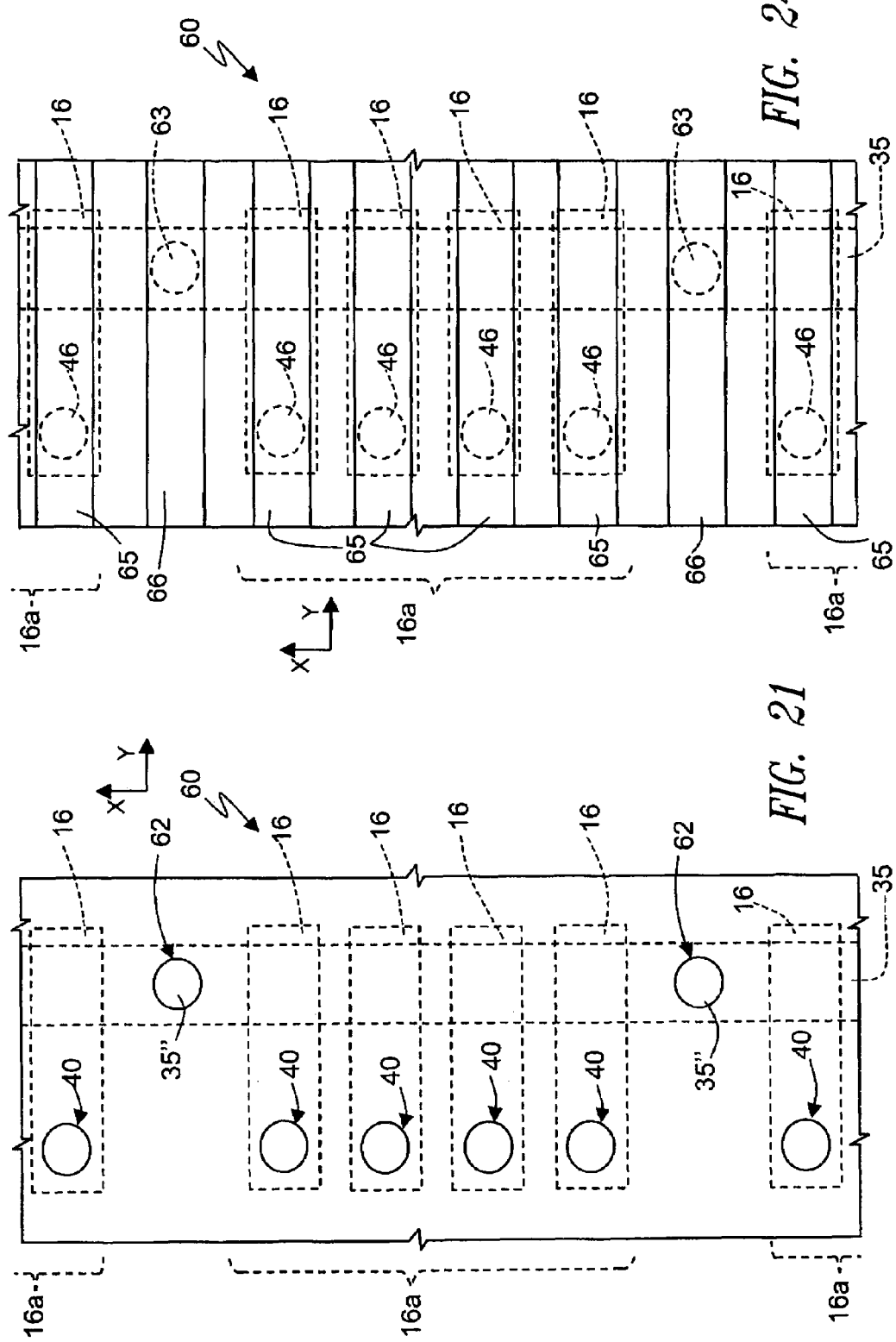

PROCESS FOR MANUFACTURING A PHASE CHANGE MEMORY ARRAY IN CU-DAMASCENE TECHNOLOGY AND PHASE CHANGE MEMORY ARRAY MANUFACTURED THEREBY

BACKGROUND OF THE INVENTION

1. Field of the Invention

The present invention relates to a process for manufacturing a phase change memory array in Cu-damascene technology and to a phase change memory array manufactured thereby.

2. Description of the Related Art

As is known, phase change memory (PCM) elements exploit the characteristics of materials which have the property of changing between two phases having distinct electrical characteristics. For example, these materials may change from an amorphous phase, which is disordered, to a crystalline or polycrystalline phase, which is ordered, and the two phases are associated to considerably different resistivities.

At present, alloys of group VI of the periodic table, such as Te or Se, referred to as chalcogenides or chalcogenic materials, can advantageously be used in phase change cells. The chalcogenide that currently offers the best promises is formed by a Ge, Sb and Te alloy ($Ge_2Sb_2Te_5$, GST) and is widely used for storing information in overwritable disks.

The use of the PCM elements for forming memory cells and arrays has already been proposed. In this case, the PCM elements are generally associated to selection elements, such as MOS transistors, bipolar transistors, or diodes, in order to prevent noise caused by adjacent memory cells.

BRIEF SUMMARY OF THE INVENTION

One embodiment of the present invention provides a process for manufacturing PCM arrays comprising, in a semiconductive wafer, forming a plurality of PCM cells, arranged in rows and columns; forming a plurality of resistive bit lines for connecting to each other PCM cells arranged on a same column, each of said resistive bit lines comprising a respective phase change material portion, covered by a respective barrier portion; and forming electrical connection structures for said resistive bit lines directly in contact with said barrier portions of said resistive bit lines.

A further embodiment of the present invention provides a phase change memory array, comprising: a plurality of PCM cells, arranged in rows and columns; a plurality of resistive bit lines, for connecting PCM cells arranged on a same column, each of said resistive bit lines comprising a respective phase change material portion, covered by a respective barrier portion; and electrical connection structures for said resistive bit lines, formed directly in contact with said barrier portions of said resistive bit lines.

According to the present invention there are a process for manufacturing a phase change memory array and a phase change memory array thereby manufactured, as defined in claims 1 and 13, respectively.

BRIEF DESCRIPTION OF THE SEVERAL VIEWS OF THE DRAWINGS

For a better understanding of the present invention, some preferred embodiment thereof are now described, purely by way of non-limiting example, with reference to the attached drawings, in which:

FIGS. 2-4 are cross-sections of the wafer of FIG. 1, in successive manufacturing steps, taken along the line II-II of FIG. 1;

FIGS. 5 and 6 are top plan view showing a detail of the wafer of FIG. 4, according to two alternative embodiments;

FIGS. 7 and 8 show the cross-section of FIG. 4, in successive manufacturing steps;

FIGS. 16 and 17 show the cross-sections respectively of FIG. 14 and FIG. 15, in a successive manufacturing step;

FIG. 18 is a top plan view of the wafer of FIGS. 16 and 17;

FIGS. 19 and 20 are cross-sections, taken respectively along lines XIX and XX of FIG. 21, of a semiconductor wafer at a stage of a manufacturing process according to a second embodiment of the present invention;

FIG. 21 is a top plan view of the wafer of FIGS. 19 and 20;

FIGS. 22 and 23 show the cross-sections respectively of FIG. 19 and FIG. 20, in a successive manufacturing step;

FIG. 24 is a top plan view of the wafer of FIGS. 22 and 23;

DETAILED DESCRIPTION OF THE INVENTION

A detailed description of a manufacturing process may be found in U.S. patent application Ser. No. 10/313,991, which application is incorporated herein by reference in its entirety.

According to this process, selection elements are normally first formed in the substrate of a semiconductive wafer; then, a dielectric layer is deposited on the substrate, so as to cover the selection elements, and heaters are formed in the dielectric layer. The heaters are usually made as cup-shaped regions of resistive material, filled with an insulator, and are electrically coupled to conduction terminals of respective selection elements. A mold layer of silicon nitride is formed on the dielectric layer and the heaters, and then etched to open minitrenches above the heaters; the minitrenches are arranged in rows and columns to form an array and, preferably, have sublithographic dimensions. Hereinafter, the term "sublithographic dimension" means a linear dimension smaller than the limit dimension achievable with current optical (UV) lithographic techniques, and hence smaller than 100 nm, preferably 50-60 nm, down to approximately 20 nm. A conductive stack comprising at least a chalcogenide layer of GST and a conductive layer, normally of AlCu, is then laid on the mold layer, so that the chalcogenide layer fills the minitrenches and contacts the heaters. Phase change regions are thus formed at the intersections between the minitrenches filled with chalcogenide material and the heaters. The conductive stack is then shaped to form a plurality of conductive bit lines which connect phase change regions arranged on a same column. The process is the terminated by forming word lines, connection lines for biasing the bit lines and the word lines, and deposition of a passivation layer.

A detailed description of a related manufacturing process may be found in U.S. patent application Ser. No. 10/372,761, which application is incorporated herein by reference in its entirety.

However, these processes have some limitations. In particular, shaping the conductive stack for defining the bit lines is somewhat complicated. In fact, the conductive layer of AlCu and the chalcogenic layer of GST require different etching agents, which affect each other and are scarcely compatible. Hence, the etch of the AlCu/GST stack is difficult and high precision can not be reached; hence, also the yield of the overall process is not optimal.

Figure 1:
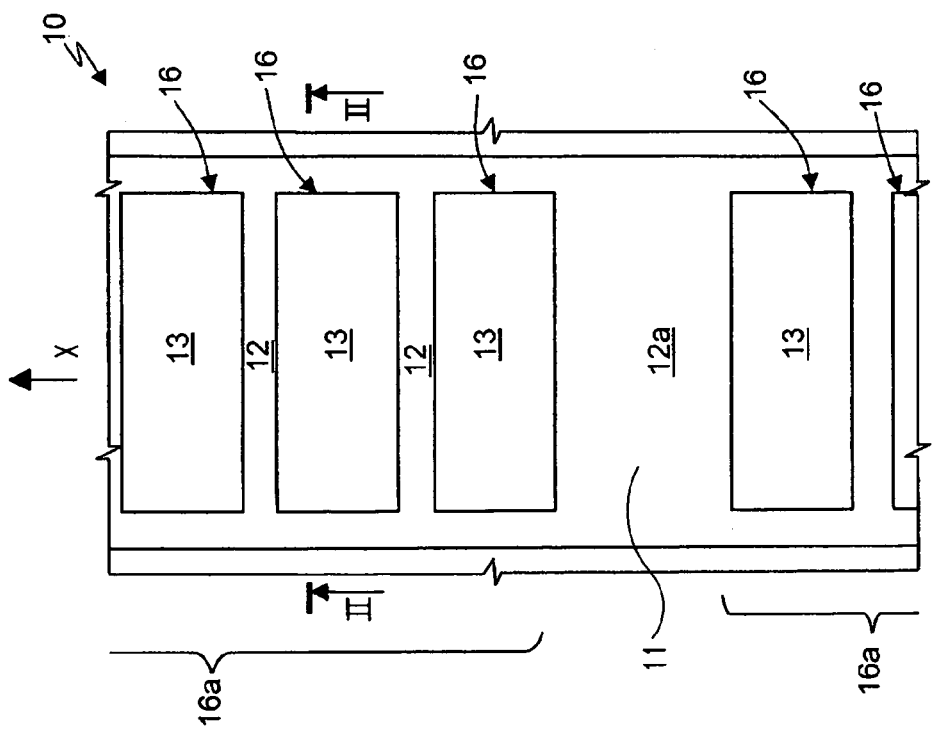
FIG. 1 is a top plan view of a semiconductor wafer at an initial stage of a manufacturing process according to a first embodiment of the present invention.

With reference to FIG. 1, initially a wafer 10 comprising a substrate 11 of P-type is subjected to standard front end steps. In particular, inside the substrate 11 insulation regions 12 are formed, so as to delimit active areas 16; then base regions 13 of N-type are implanted. The active areas 16 are arranged in rows and columns. FIG. 1 shows groups 16a of active areas 16 arranged on a same column and therefore aligned according to a column direction X; adjacent groups 16a are spaced apart from each other in the column direction X by wider insulating bands 12a.

Figure 2:
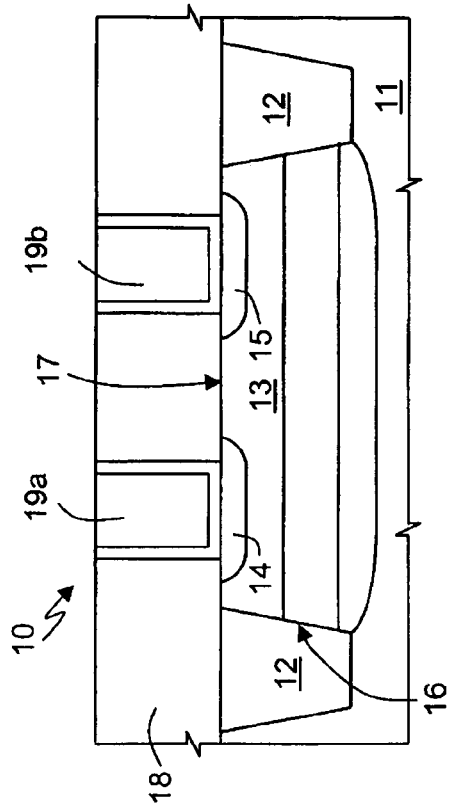

Next, FIG. 2, a first dielectric layer 18 is deposited and planarized; openings are formed in the first dielectric layer 18 above the base regions 13. At this point, using two dedicated masks and exploiting the self-alignment in the openings, base contact regions 14 of $N^+$-type and emitter regions 15 of $P^+$-type are implanted. Then the openings in the first dielectric layer 18 are covered by a barrier layer, for example a Ti/TiN layer, before being filled with tungsten to form base contacts 19a and emitter contacts 19b. The base contacts 19a are thus in direct electrical contact with the base regions 13, and the emitter contacts 19b are in direct electrical contact with the emitter regions 15. In this way, the structure of FIG. 2 is obtained. The base regions 13, base contact regions 14, emitter regions 15 and the substrate 11 form PNP bipolar transistor, which define selection elements 17 for respective memory cells.

Figure 3:
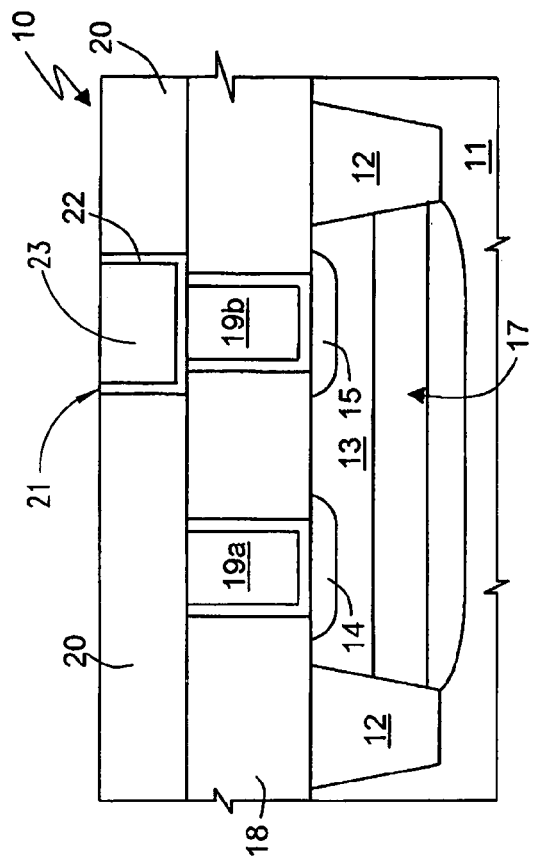

Next (FIG. 3), a second dielectric layer 20—for example, an undoped silicon glass (USG) layer is deposited, and openings 21 are formed in the second dielectric layer 20 above the emitter contact 19b. The openings 21 have dimensions dictated by the lithographic process and, for example, ovalized or rectangular shape (the term "rectangular" also comprises the particular case of a square shape). Next, a heating layer, for example of TiSiN, TiAlN or TiSiC, is deposited for a thickness of 10-50 nm, preferably 20 nm. The heating layer is designed to form a resistive element and conformally coats the walls and bottom of the openings 21, which are then completely filled with dielectric material 23. Advantageously the dielectric material 23 is the same used for forming the dielectric layer 20. The heating layer is removed outside the openings 21 by CMP ("Chemical Mechanical Polishing") and the surface of the wafer 10 is planarized. The remaining portions of the heating layer form cup-shaped regions 22 having, in top plan view from above the surface, ovalized or rectangular shape.

Next, as shown in the enlarged detail of FIG. 4, a mold layer 27, preferably of silicon nitride and having a thickness of 60 nm, and an adhesion layer 28, for instance Ti, TiSiN or Si with a thickness of 5-10 nm, are deposited in sequence. Then, minitrenches 30 having a sublithographic bottom width W, e.g. of about 20-70 nm, are opened through the mold layer 27 and the adhesion layer 28. As shown in FIG. 5, the minitrenches 30 extend between two adjacent cup-shaped regions 22 in a direction perpendicular to the width W; alternatively (FIG. 6), there is one minitrench 30 for each cup-shaped region 22.

Figure 9:
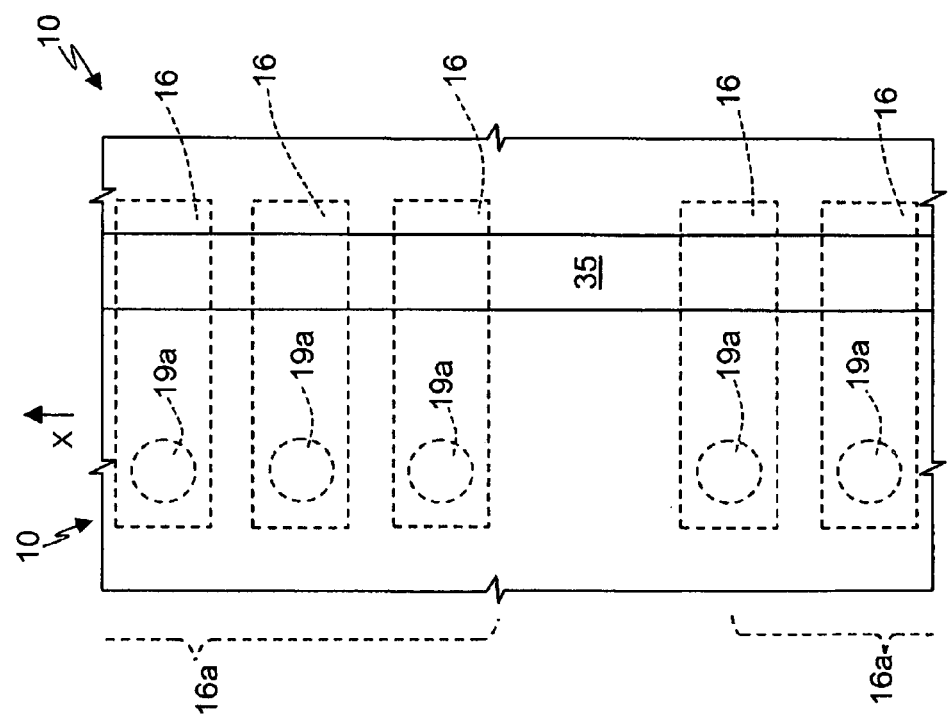
FIG. 9 is a top plan view, with parts removed, of the wafer of FIG. 8.

Next, FIG. 7, a chalcogenic layer 31 of GST ($Ge_2Sb_2Te_5$), and a first barrier layer 32, preferably of Ti/TiN, are deposited on the adhesion layer 28, so that the chalcogenic layer 31 fills the minitrenches 30 with chalcogenic thin portions 31a. The intersections between the thin portions 31a and the respective cup-shaped regions 22 define PCM cells 33, as shown in FIGS. 5 and 6. The adhesion layer 28, the chalcogenic layer 31 and the first barrier layer 32 form a conductive stack 34, which is then shaped by a masked etch to define resistive bit lines 35, as shown in FIG. 8 (where only one resistive bit line 35 is illustrated). In detail, each resistive bit line 35 comprises adhesion bands 28', a chalcogenic band 31' and a barrier band 32'; moreover, each resistive bit line 35 is connected to a respective plurality of PCM cells 33, and extends parallel to the column direction X (see also FIG. 9).

Figure 10:
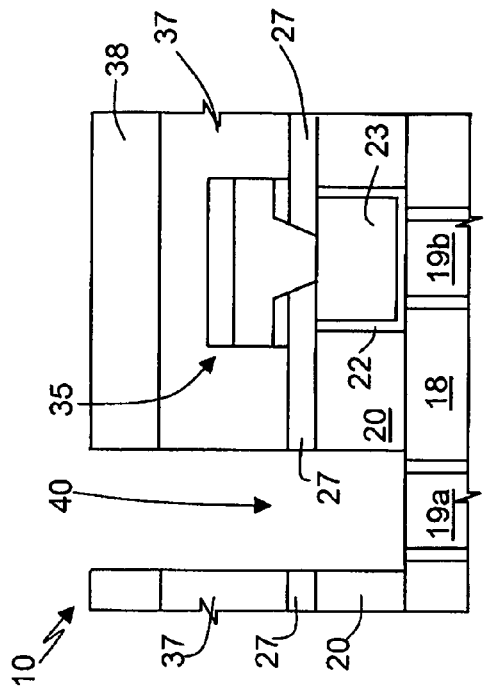
FIGS. 10-12 show the cross-section of FIG. 8, in successive manufacturing steps.
Figure 11:
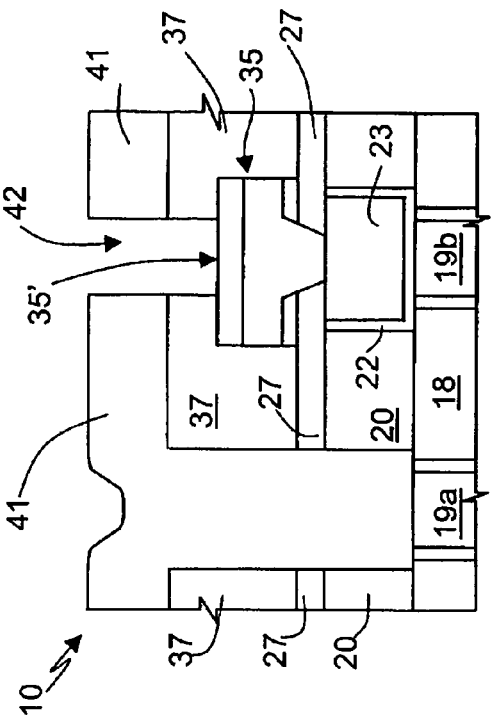

Next, FIG. 10, third dielectric layer 37 is deposited on the wafer 10, so as to cover the resistive bit lines 35, and is planarized. The wafer 10 then undergoes a two-step etch, according to the so-called "Cu-Damascene" technique. More particularly, a first contact mask 38 is initially deposited to protect the surface of the wafer 10 except above the base contacts 19a of the selection elements 17. The third dielectric layer 37, the mold layer 27 and the second dielectric layer 20 are sequentially etched using the first contact mask 38 and word line vias 40 are opened, so as to expose the base contacts 19a. As shown in FIG. 11, the first contact mask 38 is removed and a second contact mask 41 is formed, which protects the base contacts 19a and exposes the third dielectric layer 37 above central portions 35' of the resistive bit lines 35. The third dielectric layer 37 is further etched and bit line trenches 42 are opened; in detail, the bit line trenches 42 have elongated shape, are continuous and run parallel to the resistive bit lines 35, the central portions 35' whereof are thus exposed. Moreover, there is one word line via 40 for each base contact 19a and, accordingly, for each active area 16. Hence, the word line vias 40 are aligned in the column direction X and are grouped similarly to the active areas 16. In other words, adjacent groups 40a of aligned word line vias 40 are spaced apart form each other by continuous portions 37a of the third dielectric layer 37.

Figure 12:
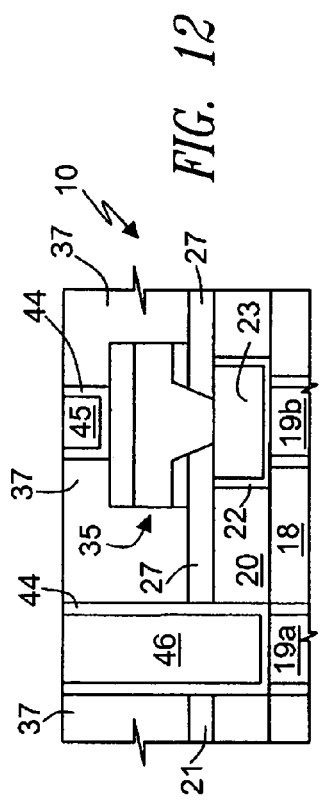

After removing the second contact mask 41, a second barrier layer 44, e.g. of TaN/Ta, is formed and coats the side and bottom walls of the word line vias 40 and of the bit line trenches 42. As illustrated in FIG. 12, the word line vias 40 and the bit line trenches 42 are then filled with copper (Cu), thereby forming metal bit lines 45 and word line plugs 46. The metal bit lines 45 run along respective resistive bit lines 35 and are electrically coupled thereto through the second barrier layer 44, which is conductive as well; the word line plugs 46 land on and are electrically coupled to the respective base contacts 19a. The second barrier layer 44 and excess copper are removed from the surface of the wafer 10 by CMP.

Figure 13:
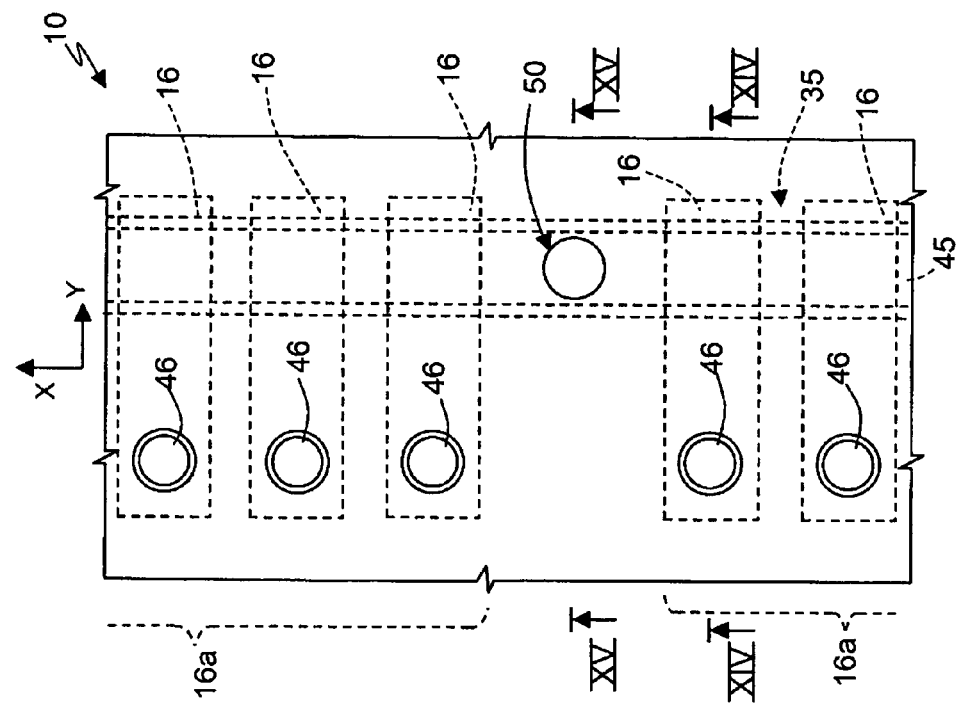
FIG. 13 is a top plan view of the wafer of FIG. 12.
Figure 14:
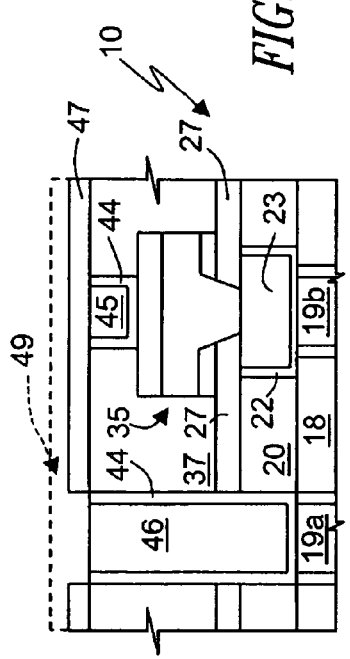
FIGS. 14 and 15 are cross-sections of the wafer of FIG. 13 in a successive manufacturing step, taken along lines XIV-XIV and XV-XV of FIG. 13, respectively.
Figure 15:
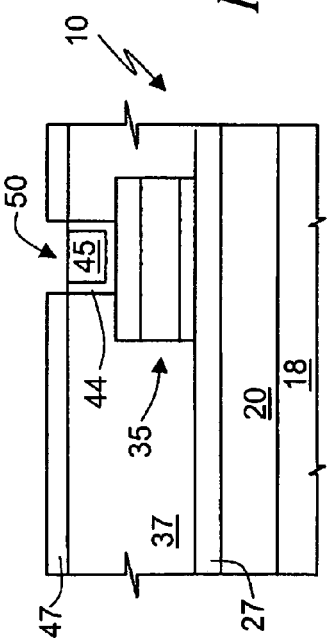

As shown in FIG. 13-15, a fourth dielectric layer 47 is deposited on the wafer 10 and is etched with a further two-step etch ("Dual Damascene" technique), to open word line trenches 49 and contact holes 50. In detail, word line trenches 49 expose respective word line plugs 46 and extend parallel to each other along a row direction Y, which is perpendicular to the column direction X. The contact holes 50 expose the metal bit lines 45 between adjacent groups 16a of active areas 16 (see FIG. 13). As illustrated in FIGS.

16-18, the word line trenches 49 and the contact holes 50 are then filled with copper, thereby forming word lines 51 and bit line straps 52, respectively. The word lines 51 are in contact with respective word line plugs 46, and are separated from the metal bit lines 45 by the fourth dielectric layer 47. Finally, a metallic layer is deposited on the fourth dielectric layer 47 and shaped, so as to form word lines 51 and bit line connections 53, running parallel to one another and perpendicular to the bit lines 35, 45. Moreover, the bit line connections 53 are arranged each between two adjacent groups of word lines 51, corresponding to adjacent groups of base contacts 19a, and contact the metal bit lines 45 through the bit line straps 52. A passivation layer 54 is then deposited on the wafer 10, to terminate the process.

The above described process has a number of advantages. In the first place, the need of a combined AlCu/GST etch (or any other metal/GST etch) is overcome. In fact, the AlCu layer is substituted with the copper lines, which are formed after shaping the resistive bit line. In other words, the etch of the Ti/GST/TiN stack is greatly simplified, owing to the use of the Cu-Damascene technology, and the yield of the overall process is correspondingly increased. Moreover, the thermal budget of the Cu-Damascene back-end is better compared to AlCu back-end. In fact, barriers and dielectrics used in standard Aluminum back-end are hotter (around 400° C.) than barriers and dielectrics used in Cu-damascene back-end (less than 350° C.).

A second embodiment of the invention will be now described with reference to FIGS. 19-24, where parts already mentioned are designated by the same numbers. Preliminary steps are initially carried out, until the word line vias 40 are opened. In particular, the selection elements 17 are formed in the substrate 11 of a wafer 60; the first dielectric layer 18 is deposited and the base and emitter contacts 19a, 19b are made therethrough; the second dielectric layer 20 is deposited; the cup-shaped regions 22 are formed in the second dielectric layer 20; the mold layer 27 and the adhesion layer 28 are deposited and defined to open the minitrenches 30; the chalcogenic layer 31 and the first barrier layer 32 are laid and delineated to form the resistive bit lines 35, which are covered with the third dielectric layer 37. The word line vias 40 are opened using the first contact mask 38, which is then removed.

Next, FIG. 20, a second contact mask 61 is defined, which protects the word line vias 40 and exposes the third dielectric layer 37 over the resistive bit lines 35 only at intervals, between adjacent groups 16a of active areas 16. The third dielectric layer 37 is then etched through the second contact mask 61 and bit line vias 62 are opened (FIG. 21); hence, exposed portions 35" of resistive bit lines 35 are discontinuous. Preferably, there is a plurality of bit line vias 62 for each resistive bit line 35.

After depositing the second barrier layer 44 of TaN/Ta, the word line vias 40 and the bit line vias 62 are filled with copper and the word line plugs 46 and bit line plugs 63 are formed (FIGS. 22, 23). So, the bit line plugs 63 are electrically coupled to respective resistive bit lines 35. Moreover, each resistive bit line is provided with a plurality of bit line plugs 63, arranged at intervals; more particularly, the bit line plugs 63 are located between adjacent groups of word line plugs 46, corresponding to respective adjacent groups 16a of active areas 16 along the column direction X. Next, a metallic layer is deposited directly on the third dielectric layer 37 and is defined to form word lines 65 and bit line connections 66, which are all co-planar. In detail, the word lines 65 are connected to the base contacts 19b, through respective word line plugs 46, whereas the bit line connections 66 are connected to the resistive bit lines 35 through respective bit line plugs 63. Moreover, the word lines 65 and the bit line connections 66 run parallel to the row direction Y and perpendicular to the resistive bit lines 35 (see FIG. 24); bit line connections 66 and groups of word lines 65 corresponding to adjacent groups 16a of active areas 16 alternate along the column direction X. Finally, the passivation layer 54 is deposited on the wafer 60.

The second embodiment of the invention has further advantages. The resistive bit lines, in fact, are coupled to the bit line connection just through the bit line plugs, instead of exploiting metal bit lines (of copper). Accordingly, the thermal isolation of the PCM elements underlying the resistive bit lines is significantly improved. As far as programming a PCM array involves heating the PCM elements, it is clear that thermal isolation is an important requirement in this kind of device: on the one hand, in fact, programming errors are reduced and, on the other hand, lower programming currents are required. Exploiting small area bit line plugs instead of metal bit lines reduces mechanical stress on the PCM elements as well.

Figure 25:
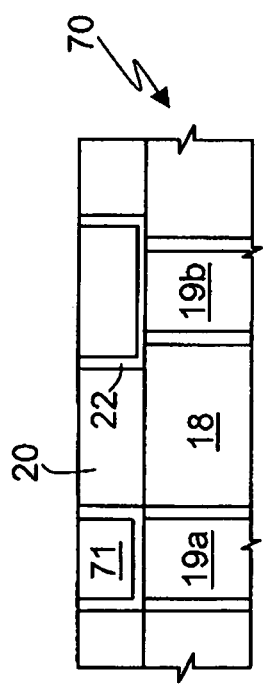

A third embodiment of the invention will be hereinafter described, with reference to FIGS. 25-27. Initially, in a wafer 70 the selection elements 17, the base and emitter contacts 19a, 19b and the cup-shaped regions are formed.

Before depositing the mold layer 27, additional plugs 71 of tungsten are formed in the second dielectric layer 20, directly in contact with respective base contacts 19a. In particular, the second dielectric layer 20 is etched to form openings exposing the base contacts 19a, which are coated with a barrier layer 73 of Ti/TiN and filled with tungsten. It is understood that the additional plugs 71 may be formed before the cup-shaped regions 22 as well.

Figure 26:
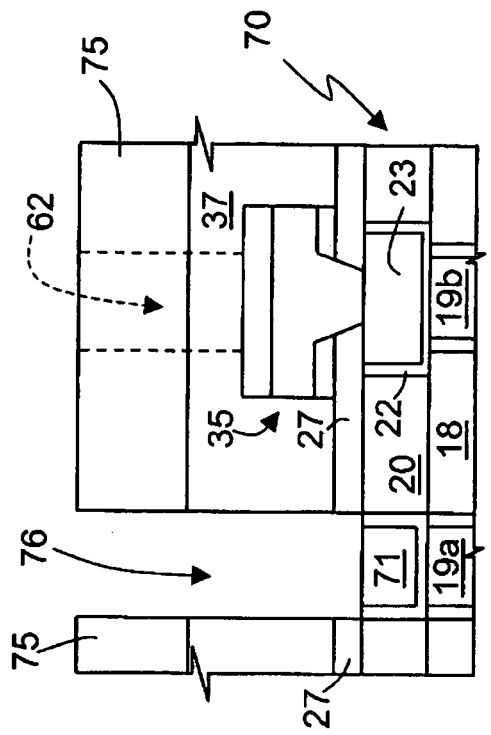
FIGS. 25-27 are cross-section of a semiconductor wafer in successive manufacturing steps of a process according to a third embodiment of the present invention.
Figure 27:
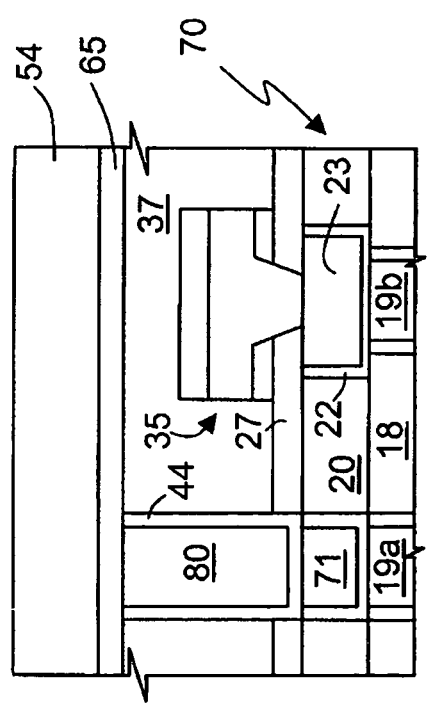

After removing the excess Ti/TiN and tungsten by CMP, the mold layer 27 and the adhesion layer 28 are deposited and etched to form the minitrenches 30 (FIG. 26). As above described, the chalcogenic layer 31 and the first barrier layer 32 are deposited and subsequently shaped to define the resistive bit lines 35. Next, the third dielectric layer 37 is deposited on the wafer 70 and is etched using a single contact mask 75 to simultaneously open word line vias 76, above the additional plugs 71, and the bit line vias 62, above the resistive bit lines 35, as already described. The word line vias 76 and the bit line vias 62 are coated with the second barrier layer 44 and filled with copper, to form word line plugs 80 and the bit line plugs 63, respectively.

The process is then terminated as already described with reference to FIGS. 22-24. In particular, the word lines 65 and the bit line connections 66 are directly formed on the third dielectric layer 37 and subsequently protected with the passivation layer 54. The structure of FIG. 27 is thus obtained.

The provision of the additional plugs 71 advantageously reduces the aspect ratio of the word line vias 76, especially in the case the second and third dielectric layer 20, 37 are thick. In particular, the word line vias 76 are easy to fill with copper to form uniform plugs. On the contrary, gaps or air bubbles may remain when deeper vias, opened through thick dielectric layers, are to be filled.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Finally, it is clear that numerous modifications and variations may be made to the process and to the memory array described and illustrated herein, all falling within the scope of the invention, as defined in the attached claims. In the first place, the selection elements may comprise devices of a different type, such as MOS transistors or diodes. Moreover, in the above described preferred embodiments, the mold layer is made of silicon nitride, but it may of other materials as well, such as USG.

The invention claimed is:

1. A process for manufacturing a phase change memory array, comprising the steps of:
   in a semiconductive wafer, forming a plurality of PCM cells, arranged in rows and columns;
   forming a plurality of resistive bit lines, each resistive bit line connecting to each other PCM cells arranged on a same column, each of said resistive bit lines comprising a respective phase change material portion as an elongated band along the same column, covered by a respective conductive barrier portion; and
   forming electrical connection structures for said resistive bit lines directly in contact with said conductive barrier portions of said resistive bit lines after forming said resistive bit lines.

2. A process according to claim 1 wherein said step of forming electrical connection structures comprises:
   depositing a dielectric layer, covering said resistive bit lines;
   forming first apertures through said dielectric layer, so as to expose portions of said resistive bit lines; and
   filling said first apertures with copper.

3. A process according to claim 2 wherein said step of forming electrical connection structures comprises forming metal bit lines extending parallel to and above respective said resistive bit lines.

4. A process according to claim 3 wherein said step of forming first apertures comprises forming elongated trenches exposing continuous portions of respective said resistive bit lines, said metal bit lines being formed inside said elongated trenches.

5. A process according to claim 2 wherein said step of forming electrical connection structures comprises forming at least one first plug for each said resistive bit line.

6. A process according to claim 5 wherein said step of forming electrical connection structures comprises forming a plurality of said first plugs for each said resistive bit line, said first plugs being arranged at intervals.

7. A process according to claim 6 wherein said step of forming first apertures comprises forming first vias, exposing discontinuous portions of respective said resistive bit lines, said first plugs being formed inside respective said first vias.

8. A process according to claim 2, further comprising the step of forming a plurality of second plugs through said dielectric layer.

9. A process according to claim 8 wherein said step of forming a plurality of second plugs comprises:
   forming a plurality of second vias through said dielectric layer;
   filling said second vias with copper.

10. A process according to claim 8, further comprising the steps of:
    in a substrate of said semiconductive wafer, forming a plurality of active areas, arranged in rows and columns, adjacent groups of the active areas being spaced apart from each other along a column direction;
    forming a plurality of selection elements in respective active areas;
    forming a dielectric region; and
    in said dielectric region, forming a plurality of cup-shaped regions of a heating material, each of said cup-shaped regions being coupled to a first conduction terminal of a respective said selection element;
    wherein said second plugs are in electrical connection with a second conduction terminal of a respective said selection element.

11. A process according to claim 10, further comprising the step of forming additional plugs through said dielectric region, said second plugs being in contact with respective said additional plugs.

12. A process according to claim 1 wherein said step of forming a plurality of PCM cells comprises:
    opening a plurality of minitrenches in a mold layer, said minitrenches having at least one sublithographic dimension; and
    depositing a phase change material layer, thereby filling said minitrenches with thin phase change material portions;
    and wherein said step of forming a plurality of resistive bit lines comprises:
    depositing a barrier layer on said phase change material layer; and
    shaping said barrier layer and said phase change material layer as elongated bands.

13. A phase change memory array, comprising:
    a plurality of PCM cells, arranged in rows and columns;
    a plurality of resistive bit lines, for connecting PCM cells arranged on a same column, each of said resistive bit lines comprising a respective phase change material portion as an elongated band along the same column, covered by a respective conductive barrier portion; and
    electrical connection structures for said resistive bit lines, formed directly in contact with said conductive barrier portions of said resistive bit lines.

14. A phase change memory array according to claim 13 wherein said electrical connection structures comprise a plurality of copper bit lines, arranged parallel and above respective said resistive bit lines, and electrically coupled thereto.

15. A phase change memory array according to claim 13 wherein said electrical connection structures comprise a plurality of first copper plugs, arranged at intervals above respective said resistive bit lines, and electrically coupled thereto.

16. A phase change memory array according to claim 13, further comprising:
    in a substrate of a semiconductive wafer, a plurality of active areas, arranged in rows and columns, adjacent groups of active areas being spaced apart from each other along a column direction;
    a plurality of selection elements in respective said active areas;
    a dielectric region; and
    in said dielectric region, a plurality of cup-shaped regions of a heating material, each of said cup-shaped regions being coupled to a first conduction terminal of a respective said selection element.

17. A phase change memory array according to claim 16 further comprising a plurality of second copper plugs in the dielectric region, each second copper plug being in electrical connection with a second conduction terminal of the respective said selection element.

18. A phase change memory array according to claim 17, further comprising, in said dielectric region, additional plugs, arranged between and in contact with respective second copper plugs and second conduction terminals of respective said selection elements.

19. A process for manufacturing a phase change memory array, comprising:
in a semiconductive wafer, forming a plurality of PCM cells, arranged in rows and columns, each PCM cell having a sublithographic dimension;
forming a plurality of resistive bit lines for connecting each PCM cells arranged on a same column, each of said resistive bit lines comprising a respective phase change material portion, covered by a respective barrier portion; and
forming electrical connection structures for said resistive bit lines directly in contact with said barrier portions of said resistive bit lines after forming said resistive bit lines.

20. A process according to claim 19 wherein said step of forming electrical connection structures comprises:
depositing a dielectric layer, covering said resistive bit lines;
forming first apertures through said dielectric layer, so as to expose portions of said resistive bit lines; and
filling said first apertures with copper.

21. A process according to claim 20 wherein said step of forming electrical connection structures comprises forming metal bit lines extending parallel to and above respective said resistive bit lines.

22. A process according to claim 21 wherein said step of forming first apertures comprises forming elongated trenches exposing continuous portions of respective said resistive bit lines, said metal bit lines being formed inside said elongated trenches.

23. A process according to claim 19 wherein forming each resistive bit line comprises forming the respective phase change material portion and the respective barrier portion into elongated bands along the same column.

24. A process for manufacturing a phase change memory array, comprising the steps of:
in a semiconductive wafer, forming a plurality of PCM cells, arranged in rows and columns;
forming a plurality of resistive bit lines for connecting to each other PCM cells arranged on a same column, each of said resistive bit lines comprising a respective phase change material portion, covered by a respective barrier portion; and
forming electrical connection structures for said resistive bit lines directly in contact with said barrier portions of said resistive bit lines after forming said resistive bit lines, wherein said step of forming electrical connection structures comprises:
depositing a dielectric layer, covering said resistive bit lines;
forming first apertures through said dielectric layer, so as to expose portions of said resistive bit lines;
filling said first apertures with copper; and
forming at least one first plug for each said resistive bit line, wherein said step of forming electrical connection structures comprises forming a plurality of said first plugs for each said resistive bit line, said first plugs being arranged at intervals.

25. A process according to claim 24 wherein said step of forming first apertures comprises forming first vias, exposing discontinuous portions of respective said resistive bit lines, said first plugs being formed inside respective said first vias.

26. A process according to claim 25 further comprising forming a plurality of second vias through said dielectric layer and filling said second vias with copper to form a plurality of second plugs.

27. A phase change memory array, comprising:
a plurality of PCM cells, arranged in rows and columns;
a plurality of resistive bit lines, for connecting PCM cells arranged on a same column, each of said resistive bit lines comprising a respective phase change material portion, covered by a respective barrier portion; and
electrical connection structures for said resistive bit lines, formed directly in contact with said barrier portions of said resistive bit lines, wherein said electrical connection structures comprise a plurality of first copper plugs, arranged at intervals above respective said resistive bit lines, and electrically coupled thereto.

28. A phase change memory array according to claim 27 further comprising:
a substrate of a semiconductive wafer including a plurality of active areas, arranged in rows and columns, adjacent groups of active areas being spaced apart from each other along a column direction;
a plurality of selection elements in respective said active areas;
a dielectric region; and
in said dielectric region, a plurality of cup-shaped regions of a heating material, each of said cup-shaped regions being coupled to a first conduction terminal of a respective said selection element.

29. A phase change memory array according to claim 28 further comprising a plurality of second copper plugs in the dielectric region, each second copper plug being in electrical connection with a second conduction terminal of the respective said selection element.

* * * * *

UNITED STATES PATENT AND TRADEMARK OFFICE
CERTIFICATE OF CORRECTION

PATENT NO. : 7,259,040 B2  
APPLICATION NO. : 10/902508  
DATED : August 21, 2007  
INVENTOR(S) : Fabio Pellizzer et al.

Page 1 of 1

It is certified that error appears in the above-identified patent and that said Letters Patent is hereby corrected as shown below:

Title Page (75)
Inventors, "Fabio Pellizer" should read -- Fabio Pellizzer --

Item 12, "Pellizer et al." should read -- Pellizzer et al. --

Signed and Sealed this

Fifteenth Day of April, 2008

JON W. DUDAS  
*Director of the United States Patent and Trademark Office*